(12) United States Patent
Konno

(10) Patent No.: US 11,177,118 B2
(45) Date of Patent: Nov. 16, 2021

(54) SUBSTRATE PROCESSING APPARATUS AND CONTROL METHOD THEREFOR

(71) Applicant: Tokyo Electron Limited, Tokyo (JP)

(72) Inventor: Masahiko Konno, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 75 days.

(21) Appl. No.: 16/527,231

(22) Filed: Jul. 31, 2019

(65) Prior Publication Data
US 2020/0043708 A1 Feb. 6, 2020

(30) Foreign Application Priority Data

Aug. 2, 2018 (JP) .............................. JP2018-145834

(51) Int. Cl.
G05B 19/416 (2006.01)
H01J 37/32 (2006.01)
H01L 21/67 (2006.01)

(52) U.S. Cl.
CPC ...... *H01J 37/32724* (2013.01); *G05B 19/416* (2013.01); *H01L 21/67167* (2013.01); *H01L 21/67253* (2013.01); *G05B 2219/37371* (2013.01); *H01J 2237/002* (2013.01)

(58) Field of Classification Search
CPC .......... H01J 37/32724; H01J 2237/002; H01L 21/67167; H01L 21/67253; H01L 21/67742; H01L 21/67288; H01L 21/67017; G05B 19/416; G05B 2219/37371
See application file for complete search history.

(56) References Cited

U.S. PATENT DOCUMENTS

| 4,814,752 A | * | 3/1989 | Lehman | ................ D06F 39/081 |
| | | | | 200/61.04 |
| 2009/0224927 A1 | * | 9/2009 | Sudy | ....................... G01M 3/24 |
| | | | | 340/605 |
| 2018/0001440 A1 | * | 1/2018 | Aono | ................ H01L 21/68707 |

FOREIGN PATENT DOCUMENTS

JP 2002-299333 A 10/2002

* cited by examiner

*Primary Examiner* — Christopher E. Everett
(74) *Attorney, Agent, or Firm* — Pearne & Gordon LLP

(57) ABSTRACT

A substrate processing apparatus configured to perform a preset processing on a substrate includes a pipe through which a liquid flows; a liquid leakage collector configured to receive the liquid leaking from the pipe; a first detector provided within the liquid leakage collector, and configured to detect the liquid; a second detector provided at a position higher than the first detector within the liquid leakage collector, and configured to detect the liquid; an indicator configured to notify liquid leakage information indicating a liquid leakage; a power supply configured to perform a power feed to the substrate processing apparatus; and a controller configured to control the indicator to notify the liquid leakage information based on a detection result of the first detector, and control the power supply to stop the power feed to the substrate processing apparatus based on a detection result of the second detector.

5 Claims, 8 Drawing Sheets

SUBSTRATE PROCESSING APPARATUS AND CONTROL METHOD THEREFOR

CROSS-REFERENCE TO RELATED APPLICATION

This application claims the benefit of Japanese Patent Application No. 2018-145834 filed on Aug. 2, 2018, the entire disclosure of which is incorporated herein by reference.

TECHNICAL FIELD

The various aspects and embodiments described herein pertain generally to a substrate processing apparatus and a control method therefor.

BACKGROUND

Patent Document 1 describes a method of avoiding a risk of leakage of cooling water in a semiconductor manufacturing apparatus. In this method, if a detection result of a cooling water leakage detecting sensor provided at the semiconductor manufacturing apparatus meets a preset risk condition, a power feed to the semiconductor manufacturing apparatus is cut.
Patent Document 1: Japanese Patent Laid-open Publication No. 2002-299333

SUMMARY

In one exemplary embodiment, a substrate processing apparatus configured to perform a preset processing on a substrate includes a pipe through which a liquid flows; a liquid leakage collector configured to receive the liquid leaking from the pipe; a first detector provided within the liquid leakage collector, and configured to detect the liquid; a second detector provided at a position higher than the first detector within the liquid leakage collector, and configured to detect the liquid; an indicator configured to notify liquid leakage information indicating a liquid leakage; a power supply configured to perform a power feed to the substrate processing apparatus; and a controller configured to control the indicator to notify the liquid leakage information based on a detection result of the first detector, and control the power supply to stop the power feed to the substrate processing apparatus based on a detection result of the second detector.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
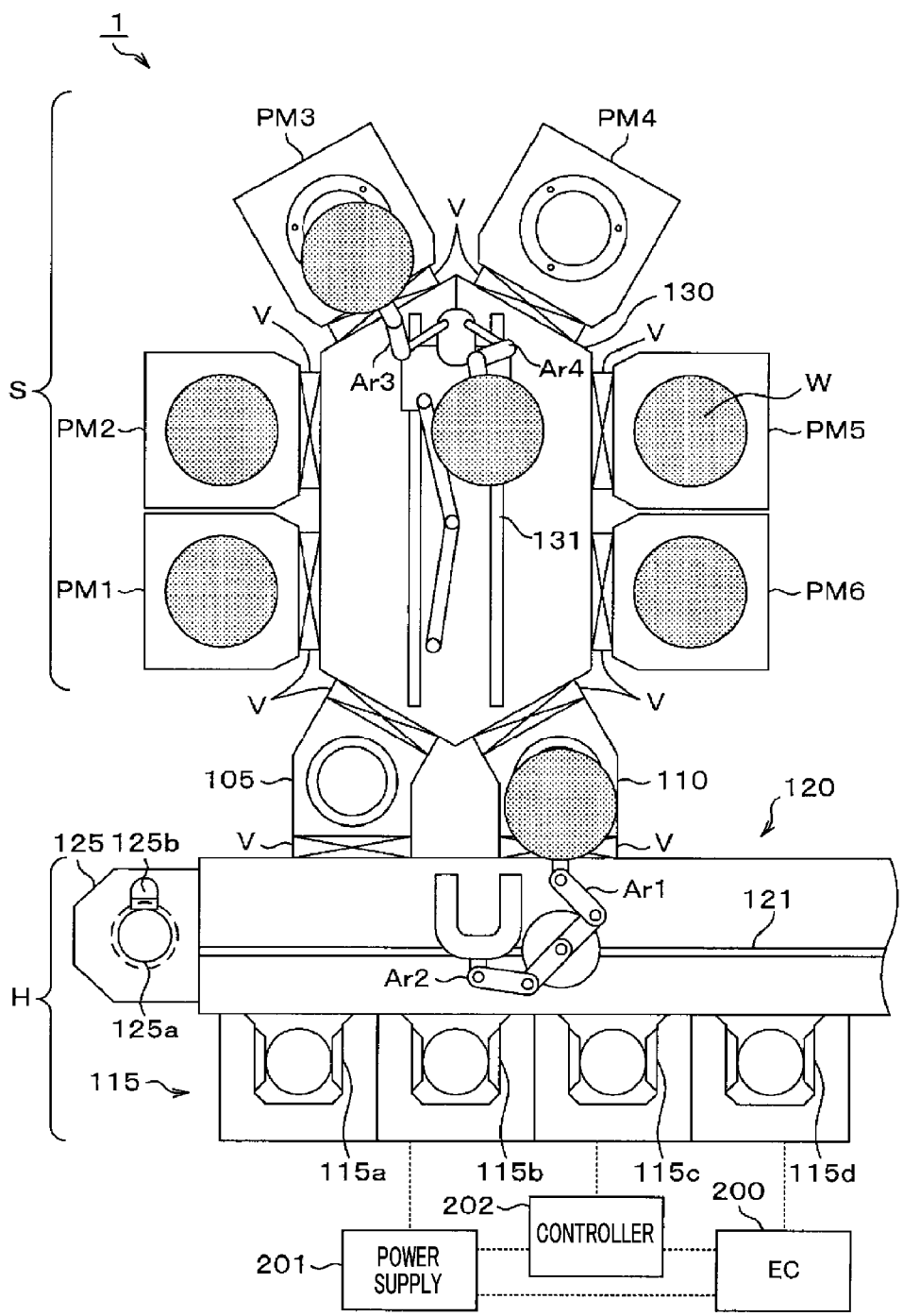
FIG. 1 is a plan view schematically illustrating a configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a conventional method of avoiding a risk of water leakage described in Patent Document 1 will be explained. In this method, when a detection result of a cooling water leakage detecting sensor provided in a semiconductor manufacturing apparatus meets a preset risk condition, a power supply to a predetermined part of the semiconductor manufacturing apparatus, specifically, a power supply to a heater of a gas temperature controller is cut, as mentioned above. Accordingly, a risk with regard to an operator is avoided.

Here, it is considered to apply the method of avoiding the risk described in Patent Document 1 to a substrate processing apparatus configured to perform a preset processing on a substrate. That is, a method of cutting a power supply to a preset part of the substrate processing apparatus when a detection result of a liquid leakage detecting sensor meets a preset risk condition is examined. In this method, since the power supply to other parts of the substrate processing apparatus except the preset part thereof is continued, there is a concern that electric shock may occur due to the liquid leakage.

Accordingly, it is considered to cut the power supply to the entire substrate processing apparatus when the detection result of the liquid leakage detecting sensor meets the risk condition. For the operator to avoid a danger, however, a condition which is not too strict need to be set as the preset risk condition. In such a case, however, the cut of the power supply to the entire substrate processing apparatus takes place frequently. If this cut of the power supply occurs frequently, a large number of substrates may be discarded as they are located within the substrate processing apparatus when the power feed is cut.

In view of the foregoing, to avoid the risk that might be caused by the liquid leakage while suppressing the substrate from being discarded, a substrate processing apparatus according to an exemplary embodiment is configured as will be described below. FIG. 1 is a plan view schematically illustrating a configuration of the substrate processing apparatus according to the exemplary embodiment. In the present specification and drawings, parts having the substantially same functions and configurations will be assigned same reference numerals, and redundant description thereof will be omitted.

A substrate processing apparatus 1 shown in FIG. 1 is configured as a cluster plasma processing apparatus, and is equipped with a transfer module H configured to transfer a substrate W and a processing module S configured to perform a preset processing such as a film forming processing or an etching processing on the substrate W. The transfer module H and the processing module S are connected via load lock chambers (LLM: Load Lock Module) 105 and 110. Although the two load lock chambers are provided in the present exemplary embodiment, the number of the load lock chambers is not limited thereto and may be more than two.

The transfer module H includes a receptacle placing table 115 and a load module 120. Four FOUPs 115a to 115d are placed on the receptacle placing table 115. The FOUPs 115a to 115d are receptacles each configured to accommodate therein a multiple number of substrates W. Further, the substrate W is a semiconductor wafer having, for example, a substantially circular disk shape.

Two transfer arms Ar1 and Ar2 configured to be contractible/extensible and pivotable are supported at the load module 120 to be slidable by magnetic driving. Each of the transfer arms Ar1 and Ar2 holds the substrate W on a fork provided at a leading end thereof and is moved on a rail 121 of the load module 120.

A position adjusting device 125 configured to perform position adjustment of the substrate W is provided at one end of the load module 120. The position adjusting device 125 adjusts a position of the substrate W by detecting a state of a peripheral portion of the substrate W by an optical sensor 125b while rotating a rotary placing table 125a on which the substrate W is placed.

A placing table configured to place the substrate W thereon is provided in each of the load lock chambers 105 and 110, and gate valves V configured to be opened/closed hermetically are provided at both ends of each load lock chamber.

With this configuration, the transfer arms Ar1 and Ar2 transfer substrates W between the FOUPs 115a to 115d, the load lock chambers 105 and 110 and the position adjusting device 125.

In the present exemplary embodiment, a transfer chamber (T/C) 130 and six process modules PM1 to PM6 are provided in the processing module S. Each of the process modules PM1 to PM6 is an example of a processing chamber configured to perform a processing such as an etching processing according to a specific recipe. Although the six processing chambers are provided in the present exemplary embodiment, the number of the processing chambers is not limited thereto as long as at least one is provided in the processing module S.

The transfer chamber 130 is connected to the respective process modules PM1 to PM6 via gate valves V configured to be opened/closed hermetically. Transfer arms Ar3 and Ar4 configured to be contractible/extensible and pivotable are provided in the transfer chamber 130. The number of the transfer arms Ar3 and Ar4 may be more than two. Each of the transfer arms Ar3 and Ar4 holds the substrate W on a fork provided at a leading end thereof and is moved on a rail 131 of the transfer chamber 130.

With this configuration, the transfer arms Ar3 and Ar4 transfer the substrates W between the load lock chambers 105 and 110 and the transfer chamber 130.

The above-described substrate processing apparatus 1 is equipped with an apparatus computer (EC) 200. The apparatus computer 200 has a program storage unit (not shown). The program storage unit stores therein a program for controlling a processing of the substrate W in the substrate processing apparatus 1. Further, the program storage unit also stores therein a program for implementing the processing in the substrate processing apparatus 1 by controlling the above-described various modules and transfer arms. In addition, the programs may be recorded in a computer-readable recording medium and installed to the apparatus computer 200 from the recording medium. This computer-readable recording medium may be, by way of example, but not limitation, a hard disk (HD), a flexible disk (FD), a compact disk (CD), a magnet optical disk (MO), a memory card, or the like.

Further, the substrate processing apparatus 1 is equipped with a power supply 201 configured to supply power to the substrate processing apparatus 1 and a controller 202 configured to control an indicator to be described later and the power supply 201. In the present exemplary embodiment, the controller 202 is implemented by a control board on which various electronic components are mounted. However, the controller 202 may be implemented by a computer.

Now, a substrate processing performed by using the substrate processing apparatus 1 having the above-described configuration will be discussed.

First, the substrate W within, for example, the FOUP 115a is carried into the load module 120. Then, the substrate W is held by the transfer arm Ar1 of the load module 120 and carried into the position adjusting device 125. Then, the position adjustment of the substrate W is carried out in the position adjusting device 125.

After the position adjustment, the substrate W is carried back into the load module 120, and then, transferred into the load lock chamber 110. Thereafter, the substrate W is held by the transfer arm Ar4 of the transfer chamber 130, and carried into the transfer chamber 130 and then, into the process module PM1.

Upon the completion of the preset plasma processing, the substrate W is carried out from the process module PM1 into the transfer chamber 130 and then is carried into the load lock chamber 105. Then, the substrate W is transferred into the load module 120 and then into the FOUP 115a.

Figure 2:
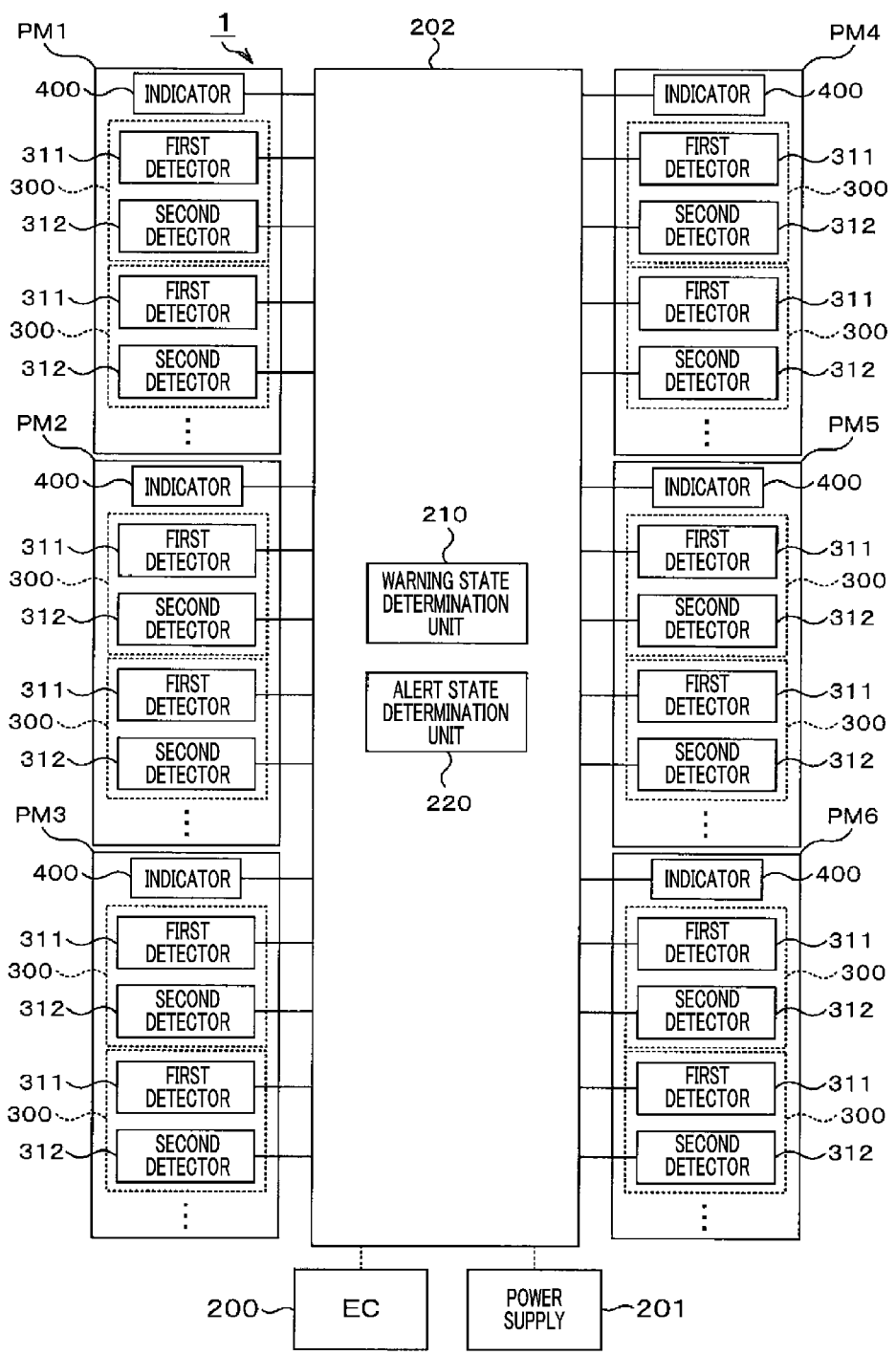
FIG. 2 is a functional block diagram for describing a configuration regarding a liquid leakage in the substrate processing apparatus.
Figure 3:
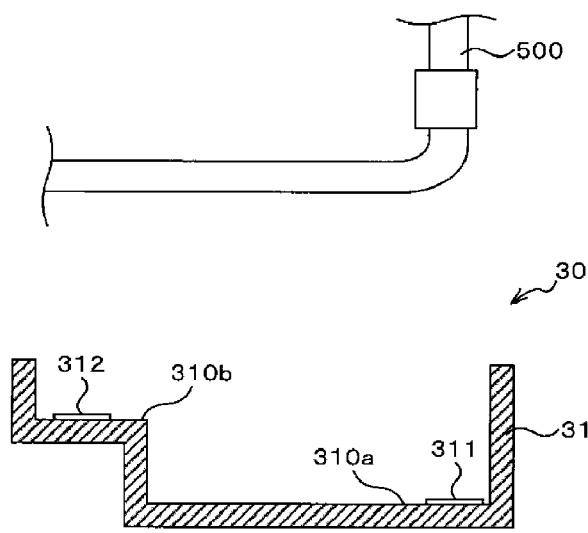
FIG. 3 is a side view illustrating a configuration example of a liquid leakage detection unit provided in the substrate processing apparatus.
Figure 4:
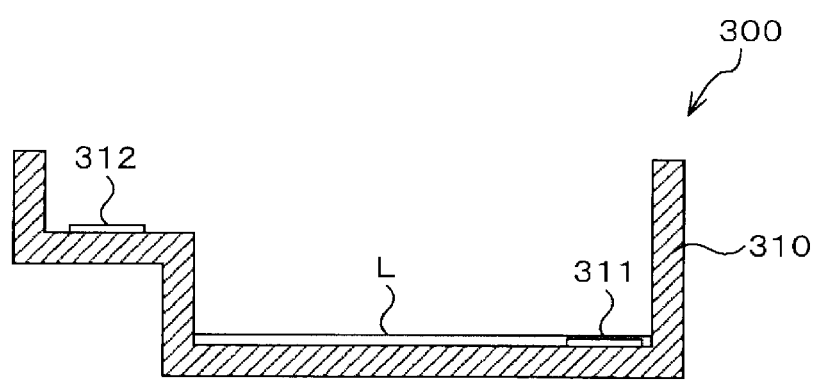
FIG. 4 is a diagram showing a type of a liquid leakage detected by the liquid leakage detection unit.
Figure 5:
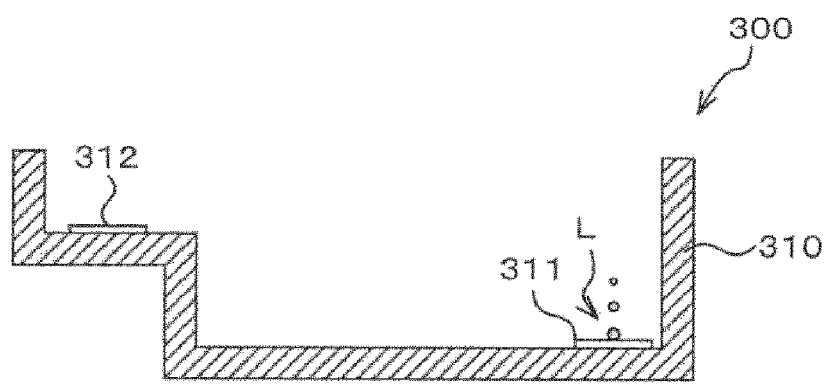
FIG. 5 is a diagram showing a type of the liquid leakage detected by the liquid leakage detection unit.
Figure 6:
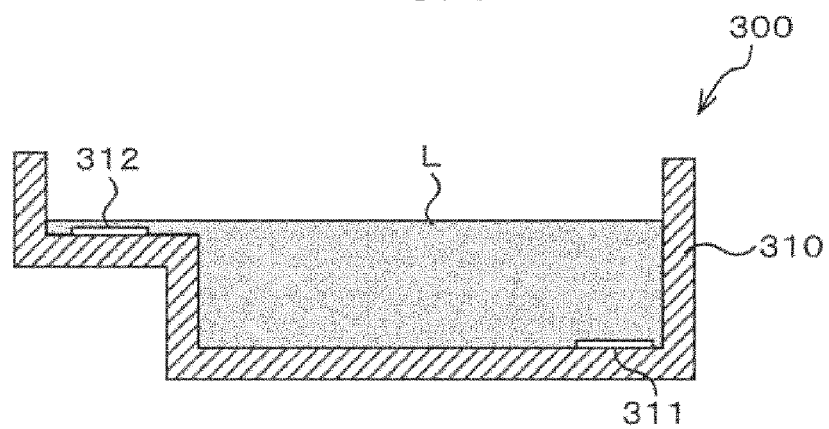
FIG. 6 is a diagram showing a type of the liquid leakage detected by the liquid leakage detection unit.

In the substrate processing apparatus 1 configured to perform the above-described substrate processing, various kinds of liquids such as cooling water are used to cool the process modules PM1 to PM6 and so forth. Below, a configuration of the substrate processing apparatus 1 for avoiding the risk of the leakage of these liquids from pipes of the process modules PM1 to PM6 will be explained. FIG. 2 is a functional block diagram for describing a configuration regarding the liquid leakage in the substrate processing apparatus 1. FIG. 3 is a side view illustrating a configuration of a liquid leakage detection unit to be described later which is provided in the substrate processing apparatus 1. FIG. 3 further provides a cross sectional view of a liquid leakage collector belonging to the liquid leakage detection unit. FIG. 4 to FIG. 6 are diagrams showing types of the liquid leakage detected by the liquid leakage detection unit.

As shown in FIG. 2, the substrate processing apparatus 1 is equipped with: a liquid leakage detection unit 300 configured to detect a state of the liquid leakage from the pipe (reference numeral 500 of FIG. 3) in which the liquid flows; and an indicator 400 configured to notify various kinds of information including liquid leakage information indicating occurrence of the liquid leak.

In the substrate processing apparatus 1, the controller 202 controls the indicator 400 and the power supply 201 based on a detection result of the liquid leakage detection unit 300. For the purpose, the controller 202 includes a warning state determination unit 210 configured to determine a warning state based on the detection result of the liquid leakage detection unit 300 and an alert state determination unit 220 configured to determine an alert state based on the detection result thereof. Here, the "warning state" refers to a state in which the liquid leakage has occurred to the extent that no harm is caused on the operator, and the "alert state" refers to a state where the liquid leakage has occurred to the extent that the harm can be caused on the operator, for example, a state where there is a concern that the operator may get an electric shock. Further, in the following description, it is assumed that a power from an additional power supply (not shown) provided separately from the power supply 201 is supplied to the controller 202, the liquid leakage detection unit 300 and the indicator 400. Accordingly, the controller 202, the liquid leakage detection unit 300 and the indicator 400 can be operated even if the power feed to the substrate processing apparatus 1 from the power supply 201 is cut (stopped).

Further, the liquid leakage detection unit 300 may be provided at one or more positions of each of the process modules PM1 to PM6. In the following description, the liquid leakage detection unit 300 is provided at six positions of each process module. That is, one or more liquid leakage detection units 300 are provided at each of the process modules PM1 to PM6. In the following description, six liquid leakage detection units 300 are provided at each process module.

Meanwhile, the single indicator 400 is provided at each of the process modules PM1 to PM6.

Furthermore, the liquid leakage detection unit 300 includes: a liquid leakage collector 310 configured to receive the liquid leaking from the pipe 500; and a first detector 311 and a second detector 312 configured to detect the liquid. The first detector 311 and the second detector 312 may be configured to detect the liquid electrically or optically.

The first detector 311 is disposed within the liquid leakage collector 310, and the second detector 312 is disposed at a position higher than the first detector 311 within the liquid leakage collector 310. To elaborate, there is a height difference on a bottom surface of the liquid leakage collector 310, and the liquid leakage collector 310 has a first bottom surface 310a and a second bottom surface 310b positioned higher than the first bottom surface 310a. The first detector 311 is provided on the first bottom surface 310a, and the second detector 312 is provided on the second bottom surface 310b.

A detection result of the first detector 311 is outputted to the warning state determination unit 210 of the controller 202. A detection result of the second detector 312 is outputted to the alert state determination unit 220 of the controller 202.

By way of example, as depicted in FIG. 4, if a liquid L is collected within the liquid leakage collector 310 up to a position of a top surface (liquid detection surface) of the first detector 311 to be thus detected by the first detector 311, the warning state determination unit 210 determines it is a warning state. Furthermore, as depicted in FIG. 5, for example, if the leaked liquid L drips on the first detector 311 to be thus detected by the first detector 311, the warning state determination unit 210 also determines that it is the warning state. If the warning state is detected, the controller 202 controls the indicator 400 to notify liquid leakage information indicating the occurrence of the liquid leak, and outputs to the apparatus computer 200 information indicating that it is the warning state. Based on this information, the apparatus computer 200 allows the substrate processing to be performed up to a preset stage where the substrate W is not discarded, and then, stops the substrate processing. Later, it is desirable for the apparatus computer 200 to cut the power feed from the power supply 201. If the operator, who has recognized the occurrence of the liquid leakage based on the warning information, removes the liquid within the liquid leakage collector 310 and repairs a leaking portion while the substrate processing is kept stopped, the power feed is begun in the substrate processing apparatus 1 and the substrate processing is resumed.

Meanwhile, assume that the liquid is collected within the liquid leakage collector 310 up to a position of a top surface (liquid detection surface) of the second detector 312, as shown in FIG. 6, during a period until the substrate processing is stopped after the warning state is detected or the liquid is collected up to the top surface of the second detector 312 as the first detector 311 fails to detect the warning state as it is broken, for example. In such a case, the liquid is detected by the second detector 312, and the alert state determination unit 220 determines it is an alert state. If the alert state is detected, the controller 202 controls the power supply 201 to cut the power feed to the substrate processing apparatus 1 immediately regardless of a stage of the substrate processing being performed. Further, if the alert state is detected, the controller 202 controls the indicator 400 to notify power stop information indicating the stop of the power feed.

As stated above, in the substrate processing apparatus 1, if the liquid is detected by the first detector 311 provided at the lower position within the liquid leakage collector 310, the power feed is not cut immediately, but the liquid leakage information is notified to the operator. Thus, through the work of the operator, the substrate processing apparatus 1 can be recovered from the liquid leaking state in early stage. Therefore, the risk of the electric shock or the like that might be caused by the liquid leakage can be avoided, and there is very little chance to cut the power feed immediately. Thus, it is possible to suppress the substrate W from being discarded by the cut of the power supply.

Further, if the liquid is detected by the second detector 312 located at the higher position within the liquid leakage collector 310, the power feed to the substrate processing apparatus 1 is immediately cut, so that the risk of the electric shock or the like that might be caused by the leakage of the liquid can be securely avoided.

Furthermore, if the liquid is detected is by the first detector 311 located at the lower position, the power feed may be cut after the substrate processing is performed up to the preset stage and stopped as stated above. Therefore, when the operator works on the substrate processing apparatus 1 after the substrate processing is stopped, the operator can be protected from being exposed to a danger such as the electrical shock or the like.

Figure 7:
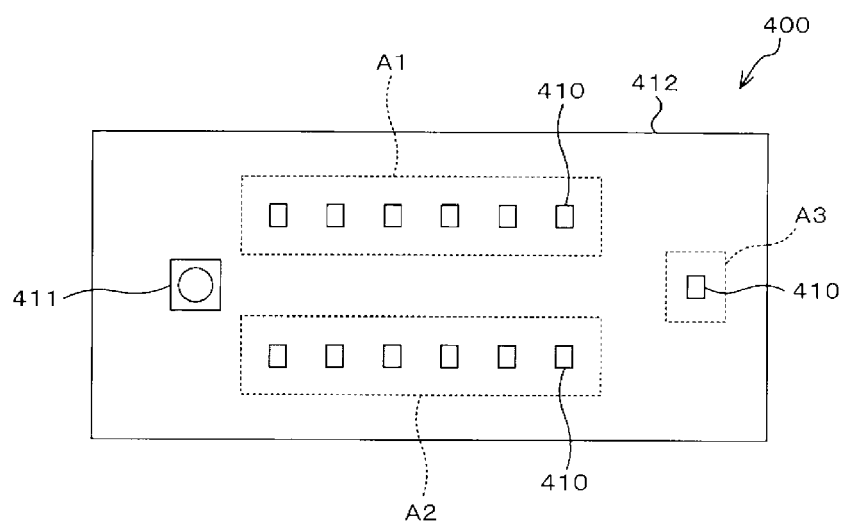
FIG. 7 is a front view illustrating a schematic configuration of an indicator provided in the substrate processing apparatus.

FIG. 7 is a front view illustrating a schematic configuration of the indicator 400.

The indicator 400 is a display panel composed of light emitting cells 410 and a reset button 411 which are provided on a plate-shaped member 412. The light emitting cells 410 are configured to notify various kinds of information by light emission, and the reset button 411 is configured to reset the light emission of the light emitting cell 410. Each of the light emitting cells 410 is, by way of non-limiting example, a LED. Further, the indicator 400 may be composed of a display device such as a liquid crystal display device.

Further, the indicator 400 has a first display region A1 for displaying and notifying the liquid leakage information indicating the occurrence of the liquid leakage and a second display region A2 for displaying and notifying the cut information indicating the cut of the power feed. The same number of light emitting cells 410 as the liquid leakage detection units 300 are provided in each of the first display region A1 and the second display region A2. In the present exemplary embodiment, six light emitting cells 410 are provided. The six light emitting cells 410 of the first display region A1 are in one-to-one correspondence with the first detectors 311 of the six liquid leakage detection units 300. Thus, depending on which light emitting cell 410 of the first display region A1 is emitting light, the operator is capable of distinguishing the first detector 311 of the liquid leakage detection unit 300 which is detecting the liquid leak, that is, the liquid leakage collector 310 in which the liquid leakage is found. Likewise, the six light emitting cells 410 of the second display region A2 are in one-to-one correspondence with the second detectors 312 of the six liquid leakage detection units 300. Thus, depending on which light emitting cell 410 of the second display region A2 is emitting light, the operator is capable of distinguishing the second detector 312 of the liquid leakage detection unit 300 which is detecting the liquid leak, that is, the liquid leakage collector 310 in which the liquid leakage is found.

Further, the indicator 400 further includes a third display region A3 configured to display whether or not the power feed from the power supply 201 is being performed. A single light emitting cell 410 is provided in the third display region A3. By the light emission of the light emitting cell 410, the operator can be informed that the power from the power supply 201 is being supplied.

Figure 8:
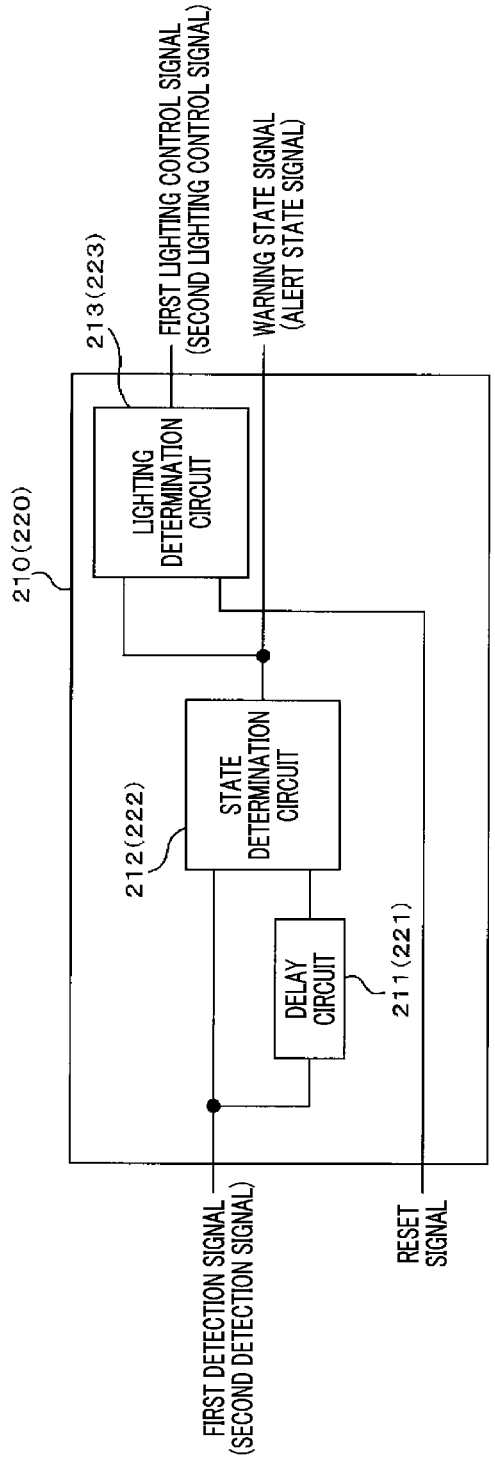
FIG. 8 is an explanatory diagram illustrating a configuration example of a warning state determination unit and an alert state determination unit.

Now, a configuration of the warning state determination unit 210 and the alert state determination unit 220 included in the controller 202 will be explained. FIG. 8 is an explanatory diagram illustrating a configuration example of the warning state determination unit 210 and the alert state determination unit 220.

Each single warning state determination unit 210 is provided to correspond to each single first detector 311, as depicted in FIG. 8, and is equipped with a delay circuit 211, a state determination circuit 212 and a lighting determination circuit 213.

The delay circuit 211 delays a first detection signal indicating the detection result of the first detector 311, which is inputted to the warning state determination unit 210, by a protection time, that is, a preset time, and outputs the delayed first detection signal as a first delay signal. In the present exemplary embodiment, the first detection signal becomes High when the liquid is not detected by the first detector 311, whereas the first detection signal becomes Low when the liquid is being detected by the first detector 311 (see FIG. 9 to be described later).

The state determination circuit 212 outputs a warning state signal indicating whether the vicinity of the first detector 311 is in the warning state based on the first detection signal inputted to the warning state determination unit 210 and the first delay signal outputted from the delay circuit 211. By way of example, the state determination circuit 212 outputs the aforementioned warning state signal indicating the warning state when both the first detection signal and the first delay signal are Low. Further, in the present exemplary embodiment, it is assumed that the warning state signal is High when it is not the warning state, whereas the warning state signal is turned Low when it is the warning state. The warning state signal is outputted from the warning state determination unit 210 to be inputted to the apparatus computer 200. The apparatus computer 200 stops the substrate processing in the substrate processing apparatus 1 based on contents of the warning state signal.

With the above-described configuration, the controller 202 having the warning state determination unit 210 makes a determination that it is the warning state when the liquid is detected continuously by the first detector 311 for a preset time period, and controls the indicator 400 to notify the liquid leakage information. Therefore, even when the first detection signal becomes Low due to a noise as will be described later, a detection error for the liquid leakage, specifically, a detection error for the warning state can be suppressed.

The lighting determination circuit 213 outputs a first lighting control signal based on: a reset signal indicating whether the reset button 411 has been manipulated, the reset signal being inputted to the warning state determination unit 210; and the content of the warning state signal outputted from the state determination circuit 212. The first lighting control signal is a signal indicating whether or not to light the light emitting cell 410 corresponding to the corresponding first detector 311. The first lighting control signal is outputted from the warning state determination unit 210 to be inputted to the indicator 400. The indicator 400 controls the light emitting cell 410 of the first display region A1 in response to the first lighting control signal.

Besides, in the present exemplary embodiment, the reset signal becomes High when the reset button 411 is not manipulated, whereas it becomes Low when the reset button 411 is manipulated (see FIG. 9 to be described later).

The lighting determination circuit 213 outputs a first lighting control signal that the light emitting cell 410 needs to be lighted until the rest signal becomes Low after the warning state signal is turned Low. In the present exemplary embodiment, the first lighting control signal is High when the light emitting cell 410 does not need to be turned on, whereas it becomes Low when the light emitting cell 410 needs to be lighted (see FIG. 9 to be described later).

Further, like the warning state determination unit 210, the single alert state determination unit 220 is provided to correspond to each single second detector 312, and is equipped with a delay circuit 221, a state determination circuit 222 and a lighting determination circuit 223.

The delay circuit 221 delays a second detection signal indicating the detection result of the second detector 312, which is inputted to the alert state determination unit 220, by a protection time, that is, a preset time, and outputs the delayed second detection signal as a second delay signal. In the present exemplary embodiment, the second detection signal becomes High when the liquid is not detected by the second detector 312, whereas the second detection signal becomes Low when the liquid is being detected by the second detector 312 (see FIG. 9 to be described later).

The state determination circuit 222 outputs an alert state signal indicating whether the vicinity of the second detector 312 is in the alert state based on the second detection signal inputted to the alert state determination unit 220 and the second delay signal outputted from the delay circuit 221. By way of example, the state determination circuit 222 outputs the aforementioned alert state signal indicating the occurrence of the alert state when both the second detection signal and the second delay signal are Low. Further, in the present exemplary embodiment, it is assumed that the alert state signal is High when it is not the alert state, whereas the alert state signal is turned Low when it is the alert state. The alert state signal is outputted from the alert state determination unit 220 to be inputted to the power supply 201 or the like. The power supply 201 stops the power feed to the substrate processing apparatus 1 based on contents of the alert state signal.

With the above-described configuration, the controller 202 having the alert state determination unit 220 makes a determination that it is the alert state when the liquid is detected continuously by the second detector 312 for a preset time, and controls the power supply 201 to stop the power feed. Therefore, even when the second detection signal becomes Low due to a noise as will be described later, a detection error for the liquid leakage, specifically, a detection error for the alert state can be suppressed. Here, it is desirable that the preset time and the protection time according to the first detector 311 and the preset time and the protection time according to the second detector 312 are different. It is desirable that the latter is shorter. If the preset time and the protection time of the second detector 312 is set to be shorter, it will not take a long time until the power supply is cut, which might be safety.

The lighting determination circuit 223 outputs a second lighting control signal based on: a reset signal inputted to the alert state determination unit 220 and the content of the alert state signal outputted from the state determination circuit 222. The second lighting control signal is a signal indicating whether or not to light the light emitting cell 410 corresponding to the corresponding second detector 312. The second lighting control signal is outputted from the alert state determination unit 220 to be inputted to the indicator 400. The indicator 400 controls the light emitting cell 410 of the second display region A2 in response to the second lighting control signal.

For example, the lighting determination circuit 223 outputs the second lighting control signal to light the light emitting cell 410 until the rest signal becomes Low after the alert state signal is turned Low. In the present exemplary embodiment, the second lighting control signal is High when the light emitting cell 410 does not need to be turned on, whereas it becomes Low when the light emitting cell 410 needs to be lighted.

Figure 9:
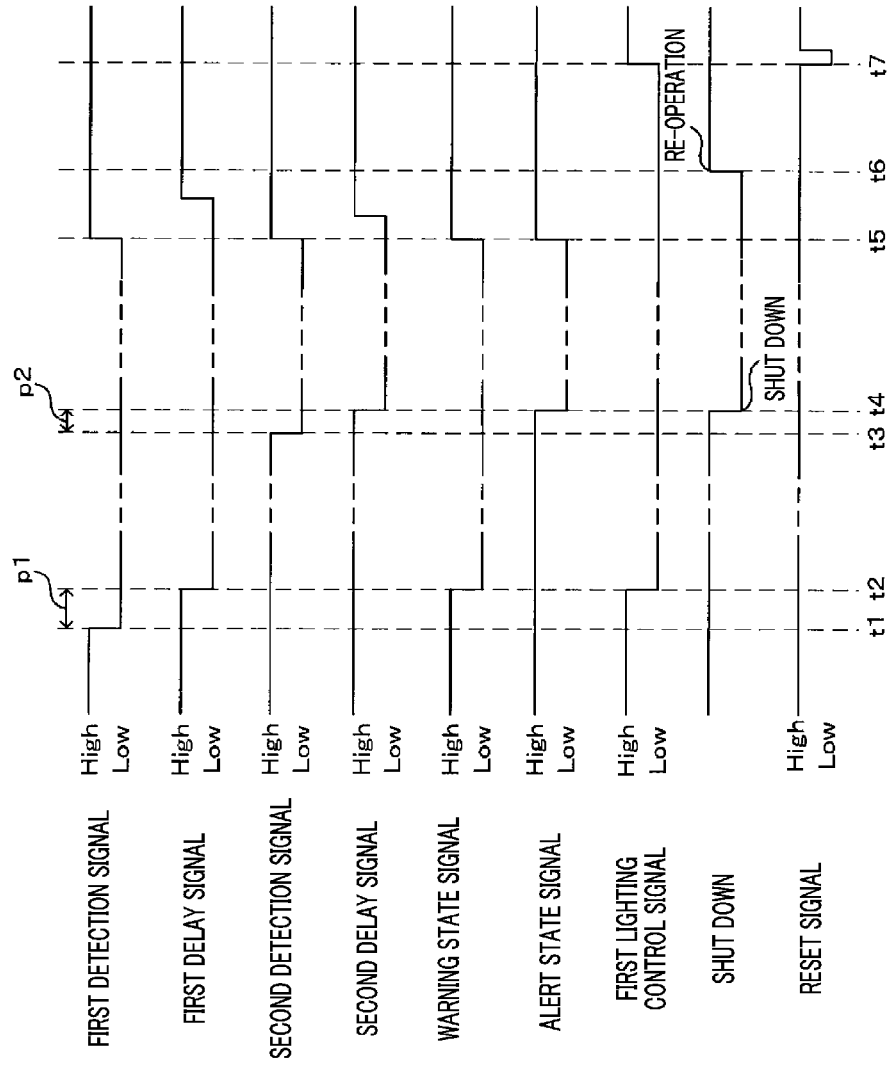
FIG. 9 is a timing chart illustrating an example of an operation regarding detection of a liquid leakage in the substrate processing apparatus.

FIG. 9 is a timing chart for describing an example of an operation regarding the liquid leakage detection of the substrate processing apparatus 1.

At a time t1 immediately after the first detection signal is turned Low as the liquid is detected by the first detector 311, the first delay signal remains High. Accordingly, the warning state signal and the first lighting control signal remain High, so the substrate processing in the substrate processing apparatus 1 is continuously performed and the notification of the alert information by the indicator 400 is not carried out.

If, however, the first detection signal remains Low as the liquid is detected by the first detector 311 continuously from the time t1 to a time t2 after an elapse of a preset time p1, the first delay signal is also turned Low, so that the warning state signal and the first lighting control signal are turned Low. As a result, a stopping processing of stopping the substrate processing is begun in the substrate processing apparatus 1, and the notification of the alert information by the indicator 400 is carried out.

At a time t3 before the stopping processing of stopping the substrate processing is completed, even if the second detection signal is turned Low as the liquid is detected by the second detector 312, the second delay signal remains High. Accordingly, the alert state signal remains High, so the power feed is not cut and the substrate processing in the substrate processing apparatus 1 is continued.

If, however, the liquid is detected by the second detector 312 continuously from the time t3 to a time t4 after an elapse of a preset time p2 and before the stopping processing is completed, the second delay signal is also turned Low, so that the alert state signal is turned Low. As a result, the power feed to the substrate processing apparatus 1 from the power supply 201 is cut, and the substrate processing apparatus 1 is shut down.

Thereafter, as the operator removes or washes away the liquid which has leaked or repairs the liquid leaking portion of the pipe, the liquid is not detected any more by the first and second detectors 311 and 312 at a time t5, so that both the first detection signal and the second detection signal are turned High. Accordingly, the warning state signal and the alert state signal are turned High. Then, the power feed from the power supply 201 is resumed by a manipulation of the operator, so that the substrate processing apparatus 1 is re-operated. At a time (time t6) when the re-operation of the substrate processing apparatus 1 is begun, the first lighting control signal is not turned High, and the notification of the liquid leakage information by the indicator 400 is not stopped. Thereafter, when the operator manipulates the reset button 411 (time t7), the first lighting control signal is turned Low, and the notification of the liquid leakage information is stopped.

In the above-described exemplary embodiment, the substrate processing apparatus 1 configured to perform the preset processing on the substrate W includes: the pipe 500 in which the liquid flows; the liquid leakage collector 310 configured to receive the liquid leaking from the pipe 500; the first detector 311 provided within the liquid leakage collector 310 and configured to detect the liquid; the second detector 312 provided at the higher position than the first detector 311 within the liquid leakage collector 310 and configured to detect the liquid; the indicator 400 configured to notify the liquid leakage information indicating the liquid leakage; the power supply 201 configured to feed the power to the substrate processing apparatus 1; and the controller 202 configured to control the indicator 400 to notify the liquid leakage information based on the detection result of the first detector 311 and control the power supply 201 to cut the power feed to the substrate processing apparatus 1 based on the detection result of the second detector 312. Further, from another view point of the exemplary embodiment, in a control method of the substrate processing apparatus configured to perform the preset processing on the substrate W, the substrate processing apparatus 1 includes: the pipe 500 in which the liquid flows; the liquid leakage collector 310 configured to receive the liquid leaking from the pipe 500; the first detector 311 provided within the liquid leakage collector 310 and configured to detect the liquid; the second detector 312 provided at the higher position than the first detector 311 within the liquid leakage collector 310 and configured to detect the liquid; the indicator 400 configured to notify the liquid leakage information indicating the leakage of the liquid; and the power supply 201 configured to perform the power feed to the substrate processing apparatus 1. The control method includes a notifying process of controlling the indicator 400 to notify the liquid leakage information based on the detection result of the first detector 311 and a power cutting process of controlling the power supply 201 to cut the power feed to the substrate processing apparatus 1 based on the detection result of the second detector 312. Thus, through the work of the operator who has been notified of the liquid leakage information, the substrate processing apparatus 1 can be recovered from the liquid leaking state in the early stage. Therefore, the risk of the electric shock or the like that might be caused by the liquid leakage can be avoided, and there is very little chance to cut the power feed immediately. Further, since the power feed to the substrate processing apparatus 1 is immediately cut if the liquid is detected by the second detector 312, the risk of the electric shock or the like that might be caused by the liquid leakage can be securely avoided. Thus, according to the present exemplary embodiment, it is possible to avoid the danger that might be cause by the liquid leakage while suppressing the substrate from being discarded.

Figure 10:
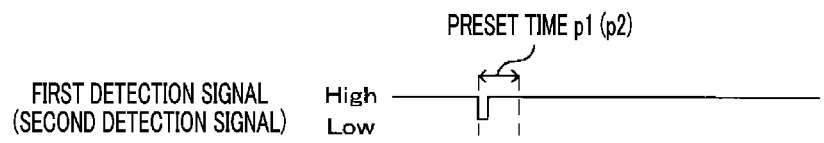
FIG. 10 is a diagram for describing an effect of the present exemplary embodiment.

As depicted in FIG. 10, however, there may be an occasion where the first detection signal is turned Low for a very short period of time because a noise is regarded as if the liquid is detected by the first detector 311. As a resolution, in the above-described exemplary embodiment, the controller 202 controls the indicator 400 to notify the liquid leakage information when the liquid is detected continuously for the preset time period by the first detector 311. Furthermore, according to another view point of the present exemplary embodiment, in the notifying processing, the indicator 400 is controlled to notify the liquid leakage information when the liquid is detected continuously for the preset time period by the first detector 311. Therefore, the notification of the liquid leakage information due to the detection error of the liquid leakage can be suppressed.

Likewise, there may be an occasion where the second detection signal is turned Low for a very short period of time because a noise is regarded as if the liquid is detected by the second detector 312. As a resolution, in the above-described exemplary embodiment, the controller 202 controls the power supply 201 to stop the power feed when the liquid is detected continuously for the preset time period by the second detector 312. Furthermore, according to view point aspect of the present exemplary embodiment, in the power cutting processing, the power supply 201 is controlled to stop the power feed when the liquid is detected continuously for the preset time period by the second detector 312. Therefore, the cutting of the power feed due to the detection error of the liquid leakage can be suppressed.

Figure 11:
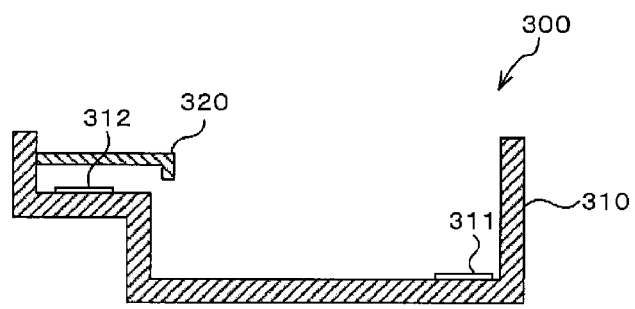
FIG. 11 is a side view illustrating another configuration of the liquid leakage detection unit provided in the substrate processing apparatus.

FIG. 11 is a side view illustrating another configuration example of the liquid leakage detection unit 300.

The liquid leakage detection unit 300 of FIG. 11 is equipped with a shield 320 configured to close the second detector 312 from above. With this configuration, it is possible to suppress an unnecessary liquid detection by the second detector 312 which might be caused as droplets of the leaked liquid fall on the second detector 312 when there is no risk of the electric shock. Further, with this configuration, when a foreign substance such as an apparatus component falls on the second detector 312, the foreign substance can be suppressed from being detected as a liquid by the second detector 312.

Moreover, though not illustrated, a shield configured to cover the first detector 311 from above may be provided at the liquid leakage detection unit 300. With this configuration, when a foreign substance such as an apparatus component falls on the first detector 311, the foreign substance can be suppressed from being detected as a liquid by the first detector 311.

In the above description, the liquid leakage detection units 300 are provided at the process modules PM1 to PM6. However, the liquid leakage detection units 300 may be provided at the load module 120, the transfer chamber 130, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

According to the exemplary embodiment, it is possible to avoid the risk of the water leakage while suppressing the substrate from being discarded.

We claim:

1. A substrate processing apparatus configured to perform a preset processing on a substrate, comprising:
    a pipe through which a liquid flows;
    a liquid leakage collector configured to receive the liquid leaking from the pipe;
    a first detector provided within the liquid leakage collector, and configured to detect the liquid;
    a second detector provided at a position higher than the first detector within the liquid leakage collector, and configured to detect the liquid;
    an indicator configured to notify liquid leakage information indicating a liquid leakage;
    a power supply configured to perform a power feed to the substrate processing apparatus; and
    a controller configured to control the indicator to notify the liquid leakage information based on a detection result of the first detector, and control the power supply to stop the power feed to the substrate processing apparatus based on a detection result of the second detector; and
    a shield configured to cover the second detector from above and suppress a detection error caused by a foreign substance falling on the second detector,
    wherein the shield is separate from the second detector.
2. The substrate processing apparatus of claim 1,
    wherein the controller controls the indicator to notify the liquid leakage information when the liquid is detected by the first detector continuously for a first preset time period.

3. The substrate processing apparatus of claim 2,
wherein the controller controls the power supply to stop the power feed when the liquid is detected by the second detector continuously for a second preset time period.

4. The substrate processing apparatus of claim 1,
wherein the controller controls the power supply to stop the power feed when the liquid is detected by the second detector continuously for a second preset time period.

5. The substrate processing apparatus of claim 1,
wherein the shield has an opening communicating with the second detector, and
the second detector is further configured to detect the liquid entering through the opening.

* * * * *